(12) United States Patent
Mazumder et al.

(10) Patent No.: US 10,162,406 B1
(45) Date of Patent: Dec. 25, 2018

(54) SYSTEMS AND METHODS FOR FREQUENCY MODE DETECTION AND IMPLEMENTATION

(71) Applicant: MICRON TECHNOLOGY, INC., Boise, ID (US)

(72) Inventors: Kallol Mazumder, Plano, TX (US); Parthasarathy Gajapathy, Highland Village, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/692,852

(22) Filed: Aug. 31, 2017

(51) Int. Cl.
*G11C 11/4076* (2006.01)
*G06F 3/00* (2006.01)
*G11C 7/10* (2006.01)
*G06F 13/16* (2006.01)
*G11C 11/4063* (2006.01)

(52) U.S. Cl.
CPC .............. *G06F 3/002* (2013.01); *G11C 7/10* (2013.01); *G06F 13/1694* (2013.01); *G11C 11/4063* (2013.01)

(58) Field of Classification Search
CPC ................................................. G11C 11/4076
USPC ..................................................... 365/233.11
See application file for complete search history.

(56) References Cited

U.S. PATENT DOCUMENTS

| | | | | |
|---|---|---|---|---|
| 6,594,284 B1 * | 7/2003 | Page | ........................ | G01V 1/22 370/503 |
| 2002/0110037 A1 * | 8/2002 | Fukuyama | ........... | G11C 7/1021 365/230.03 |
| 2004/0066700 A1 * | 4/2004 | Lee | ........................ | G11C 7/1021 365/232 |
| 2004/0120210 A1 * | 6/2004 | Lee | ........................ | G11C 7/12 365/232 |
| 2006/0268642 A1 | 11/2006 | Chen et al. | | |
| 2010/0088487 A1 * | 4/2010 | Yuasa | ................. | G06F 12/0623 711/217 |
| 2011/0310681 A1 * | 12/2011 | Hirobe | ................. | G11C 7/10 365/189.17 |
| 2012/0230144 A1 * | 9/2012 | Nagata | .................. | G11C 8/18 365/233.11 |
| 2015/0098287 A1 | 4/2015 | Lee | | |
| 2015/0317096 A1 | 11/2015 | Bains et al. | | |

(Continued)

OTHER PUBLICATIONS

PCT International Search Report & Written Opinion; PCT Application No. PCT/US2018/029147; dated Aug. 9, 2018.

*Primary Examiner* — Min Huang
(74) *Attorney, Agent, or Firm* — Fletcher Yoder, P.C.

(57) ABSTRACT

The systems and methods provided herein identify a command acquisition mode from a plurality of command acquisition modes of a command interface of a memory device. A state of a chip select signal (CS) is identified. When the CS transitions to low from high, a first portion of a command address is captured in a first clock cycle after the CS transitions. When the command acquisition mode is in a first mode, a second portion of the command address is captured in a second clock cycle immediately after the first clock cycle. Otherwise, when the command acquisition mode is in a second mode, the second portion of the command address is captured in a third clock cycle immediately following the second clock signal. An internal command is fired, using the first portion of the command address and the second portion of the command address.

20 Claims, 4 Drawing Sheets

(56) References Cited

U.S. PATENT DOCUMENTS

2015/0371688 A1   12/2015   Pekny et al.
2017/0110173 A1*  4/2017    Matsuno .............. G11C 7/1039

* cited by examiner

SYSTEMS AND METHODS FOR FREQUENCY MODE DETECTION AND IMPLEMENTATION

BACKGROUND

Field of Invention

Embodiments of the invention relate generally to the field of computer memory systems. More specifically, embodiments of the present invention include one or more systems, devices, and methods for determining and implementing frequency modes for implementing memory commands.

Description of Related Art

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices often include memory storage devices that store electronic data. As the electronic devices become more sophisticated, an increasing number of commands may be provided for execution on the memory (e.g., via a memory controller/interface). Unfortunately, these commands may have varied execution times, some requiring a wider setup/hold window than other commands. Traditional approaches to executing these commands use a static clock cycle frequency of execution to implement commands, oftentimes resulting in inefficient command execution times for commands that can properly execute in fewer clock cycles than the commands that may use additional clock cycles for execution. Accordingly, embodiments of the present invention may be directed to enhancement through use of multiple frequency modes for execution of memory commands, resulting in support for dynamic command execution frequency changes that may increase command execution efficiency.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As input and output (IO) data rate requirements continue to develop for new memory specifications (e.g. specifications of the Joint Electron Device Engineering Council (JEDEC)), new mechanisms for increasing data processing efficiencies may be desirable. For example, dynamically changeable command execution frequencies may enable reduced latency for commands that do not utilize wide processing/access windows (e.g., by setting the command to a 1N command retrieval mode), while still allowing for the execution of commands that do utilize wide processing/access windows (e.g., by setting the command to a 2N command retrieval mode). However, dynamically transitioning command execution frequencies involve many challenges. Accordingly, embodiments disclosed herein relate to enhancement of the command acquisition/execution process, resulting in support for higher IO data rates.

Figure 1:
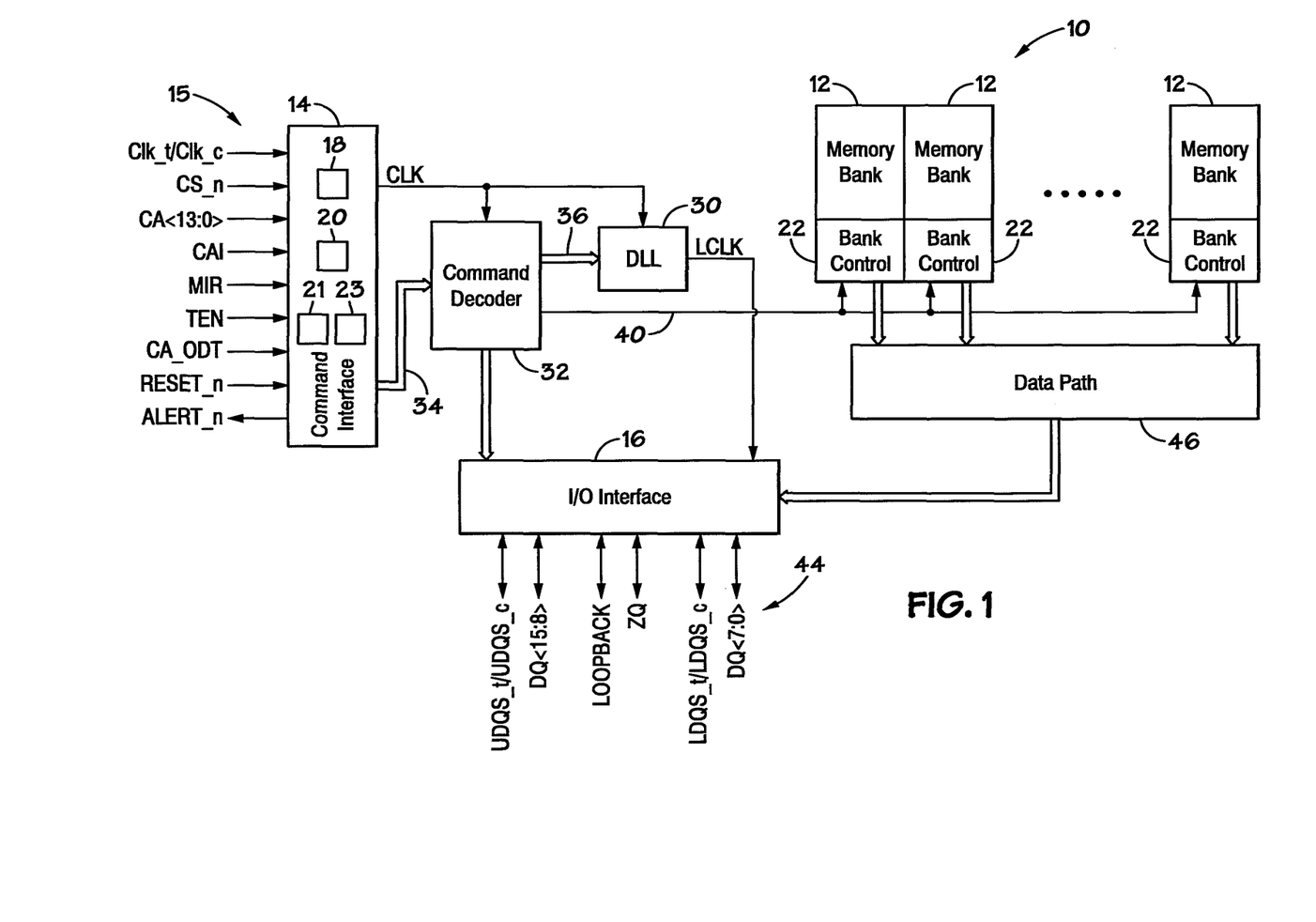
FIG. 1 is a block diagram, illustrating a memory device, in accordance with an embodiment.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. For example, when the CS_n signal drops to a low state, a command address acquisition and command execution process may begin. Access to specific banks 12 within the memory device 10 is encoded on the CA<13:0> bus with the commands.

As will be discussed in detail below, multiple modes of command processing may be supported. For example, in DDR5, some commands are two-cycle commands that are acquired over two clock cycles. For such two-cycle commands, multiple acquisition modes may be available, enabling aquisitition of commands over either immediately subsequent clock cycles or over two clock cycles with an intervening clock cycle between them. As used herein, successive clock cycles refer to clock cycles with no clock cycles therebetween. For example, in a first mode (e.g., 1N mode), a first cycle is used to acquire a first portion of the command address and in the immediately subsequent cycle (e.g., the second cycle) the remaining portion of the command address is acquired. The 1N mode is particularly useful in situations where command acquisition is predictable fast, as the command latency is reduced to two clock cycles.

In a second mode (e.g., 2N mode), one clock is skipped in between receiving the first portion of the command address and receiving the second portion of the command address. The skipped cycle is provided to issue a wider window for acquisition of command address information. This is particularly useful when additional acquisition time is needed, (e.g., during device initialization processes, etc.).

A mode register 21 may be set to indicate a particular mode of operation for command acquisition. The mode register 21 may be set via a command provided to the command interface. Once set, the mode register 21 may provide an indication of the mode (e.g., either 1N or 2N mode) and implementation of the selected mode may commence. Many factors must be considered to enable the dynamically changeable acquisition modes. As discussed in detail below, the command interface 14, command decoder 32, and/or other logic/circuitry may handle acquisition and processing of the commands for these modes. Mode selection and/or implementation may be handled by hardware circuitry and/or machine-readable instructions implemented by hardware circuitry. In the embodiment illustrated in FIG. 1, mode selection and implementation circuitry 23 of the command interface 20 may handle implementation details of the various modes.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t/and DQS_c) to provide differential pair signaling during reads and writes. For certain memory devices, such as a DDR5 SDRAM memory device, the differential pairs of DQS signals may be divided into upper and lower data strobe signals (e.g., UDQS_t/and UDQS_c; LDQS_t/ and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

As mentioned above, the command acquisition and implementation may be performed using one of a set of modes of acquisition. The discussion now turns to particular modes that may be used and particular implementations of acquiring and/or executing the commands under these modes.

1N Mode

Figure 2:
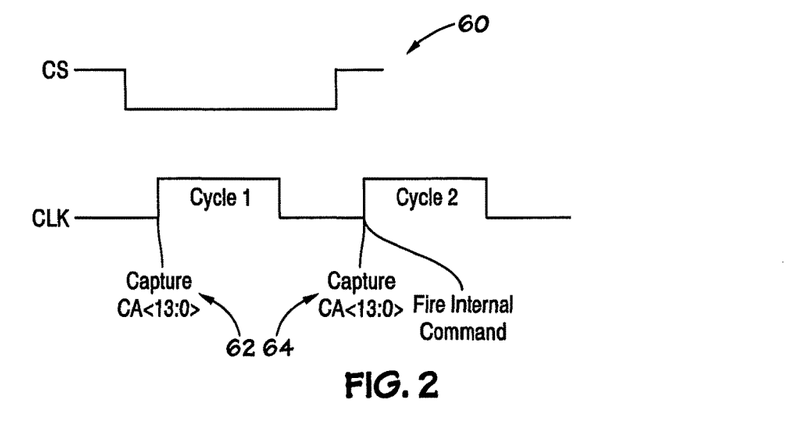
FIG. 2 illustrates a timing diagram for capture and execution of command information in 1N mode, in accordance with an embodiment.

The discussion begins with 1N mode. In 1N mode, command address information is obtained via two succeeding cycles. The 1N mode may be useful to reduce command execution latency, when a narrow command address capture window may be used. FIG. 2 illustrates a timing diagram 60 for capture and execution of command information in 1N mode, in accordance with an embodiment.

In 1N mode, the chip select signal (CS) dropping to low provides an indication of the first cycle "Cycle1" for obtaining command data (e.g., by indicating a first command address capture). In other words, the CS dropping to low triggers generation of a pair of clocks used to capture respective portions of a command address (e.g., first CA portion CA<13:0>62 and second CA portion CA<13:0>64). The first clock is generated from the first cycle "Cycle1" after the CS drop to low, resulting in capture of the first command address portion. The second clock is generated from the subsequent cycle "Cycle2", resulting in the capture of the second command address portion. The information obtained from the first and second command address captures are used together to fire an internal command, as illustrated.

2N Mode

Figure 3:
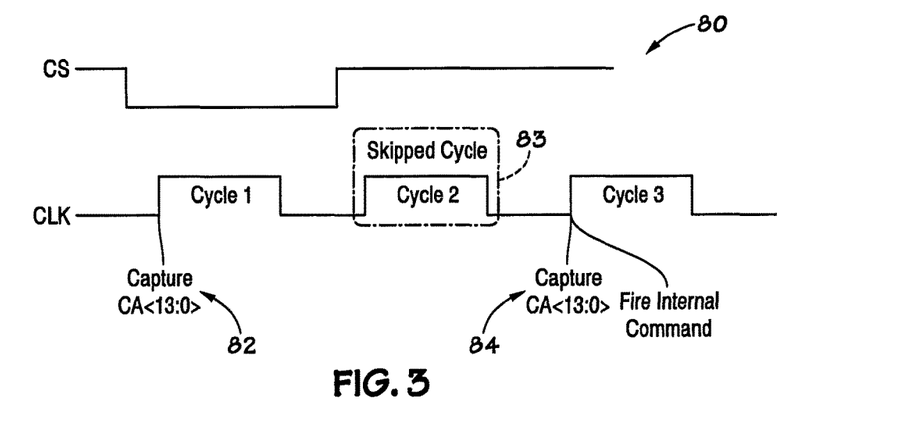
FIG. 3 illustrates a timing diagram for capture and execution of command information in 2N mode, in accordance with an embodiment.

In 2N mode, command address information is obtained via two cycles with an intermediately skipped cycle. As discussed above, the 2N mode provides a wider command address capture window, which may be useful in some scenarios (e.g., during calibration, etc.). FIG. 3 illustrates a timing diagram 80 for capture and execution of command information in 2N mode, in accordance with an embodiment.

Similar to the 1N mode, in 2N mode, the chip select signal (CS) dropping to low indicates the first cycle "Cycle1" of the command. The first clock is generated from "Cycle1", resulting in the first command address capture 82. However, in 2N mode, the second cycle "Cycle2" is skipped, as the 2N mode skips one cycle after the first cycle of the command. This is illustrated by block 83. The skipped cycle provides a wider window, enabling more time for command address information processing. Accordingly, in 2N mode, the third clock is generated from "Cycle3", triggering the second capture 84 of the command address. The information obtained from the first and second command address captures are used together to fire an internal command, as illustrated.

To perform the cycle-skipping functionality of 2N mode, 2N mode logic may be used to ensure that command/address information is not captured from the external pins during the second cycle "Cycle2". Further, because the second command capture occurs at "Cycle3" the internal mechanism may be tasked with ensuring that a command does not fire at "Cycle2".

Non-Target Commands

Figure 4:
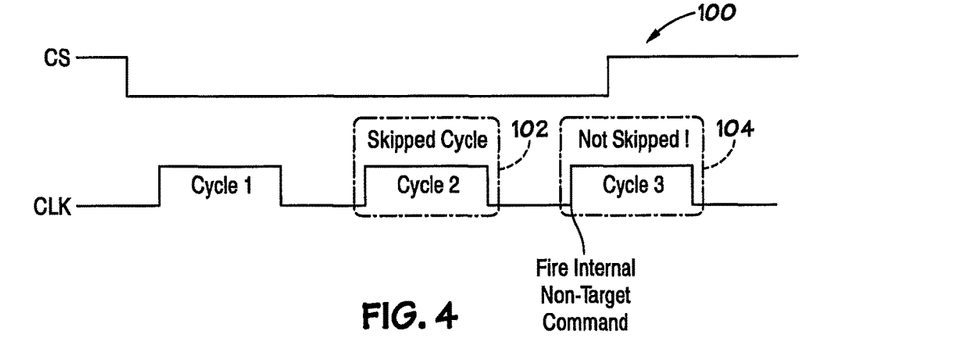
FIG. 4 illustrates a non-target command execution (e.g., a cancelled command), where the chip select (CS) signal is held low during the second cycle of the command, in accordance with an embodiment.
Figure 5:
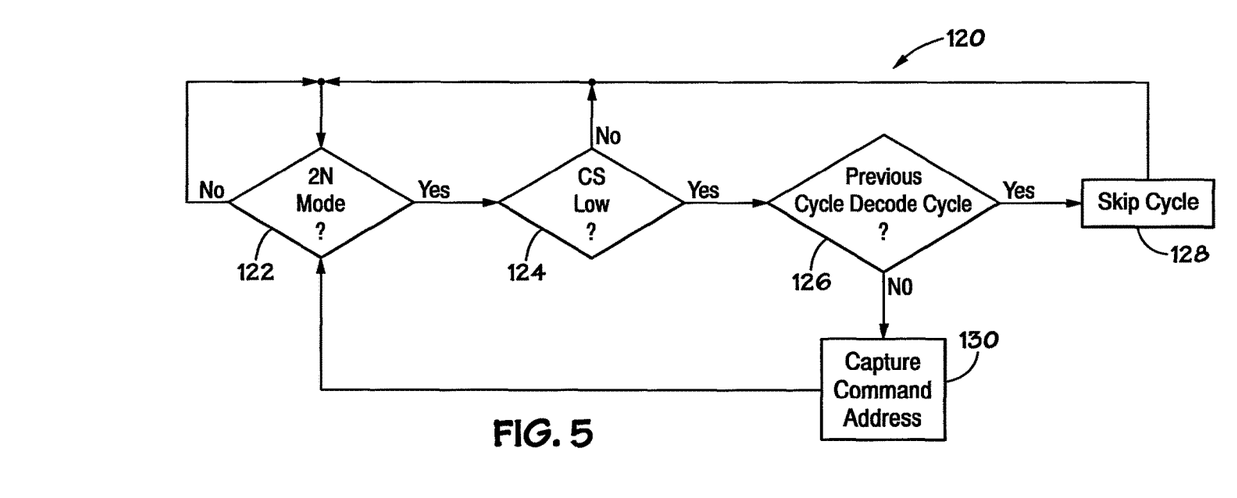
FIG. 5 is a flowchart that illustrates a process for handling non-target commands, in accordance with an embodiment.

Depending on the command, the CS may be either high or low during a second cycle. FIG. 4 illustrates a non-target command execution 100 (e.g., a cancelled command), where the CS is held low during the second cycle "Cycle2", in accordance with an embodiment. FIG. 5 is a flowchart that illustrates a process 120 for handling non-target commands, in accordance with an embodiment. As illustrated, for the cancelled two cycle command, the CS is held low for all three cycles, "Cycle1", "Cycle2", and "Cycle3". As mentioned above, in 2N mode, when CS is low, the 2N mode logic may cause the second cycle "Cycle2" to be skipped, as indicated by box 102. However, additional consideration may be needed for non-target commands. For example, while the 2N logic (e.g., harware circuitry and/or software implemented by a hardware-based processor) may look merely for a drop of CS to low and skip a subsequent cycle in 2N mode for targeted commands (e.g., commands where the CS is raised back to high during the second cycle "Cycle2"), when the CS is held low for a non-target command, such usage might result in erroneous command address information capture and/or erroneous command firing.

For instance, using this approach, the 2N mode logic would detect CS as low on the second cycle "Cycle2" and would cause the next cycle, "Cycle3", to be skipped. However, such an outcome would be erroneous, as the second command address capture and the command firing of the non-target command should be triggered by the third cycle "Cycle3" in 2N mode. Accordingly, "Cycle3" should not be skipped, as indicated by block 104. Accordingly, the 2N logic, rather than merely skipping a next clock cycle after CS is low, may include an indication of the history of past CS states (e.g., a toggle indicator) that tracks a transition of CS to low, such that only the second clock after the transition of CS to low is skipped. For example, a toggle may be set when the first command address is captured during the first cycle "Cycle1", such that the set toggle indicates that the next cycle "Cycle2" should be skipped. After the skip, the toggle may be reset, indicating not to skip the next cycle "Cycle3". When the CS remains low, the toggle may alternate between a high state and a low state for alternating cycles. As one of ordinary skill in the art may appreciate, other toggle implementations may performed to provide an indication of alternate clocks to skip.

FIG. 5 is a flowchart illustrating a process 120 for using a toggle to ensure proper skipping, in accordance with an embodiment. The process 120 begins by determining whether the command acquisition is in 2N mode (decision block 122). If not in 2N mode, processing continues without toggling (e.g., without a skipping mechanism), as the current toggle is used for skipping scenarios. However, when in 2N mode, a determination is made as to whether CS is low (decision block 124). If CS is not low, then the process continues without toggling, as no command is currently being acquired/executed. When CS is low, a determination is made as to whether the previous cycle was a decode cycle (decision block 126). As mentioned above, a toggle may be set when a decode begins. Accordingly, decision block 126 may be determined by referencing the toggle data. When the previous cycle was a decode cycle (e.g., as determined based upon accessing the toggle), the current cycle is skipped (block 128). However, when the previous cycle was not a decode cycle (e.g., as determined based upon accessing the toggle), the cycle is not skipped and the command address is captured for the current cycle (block 130).

Ghost Commands

Figure 6:
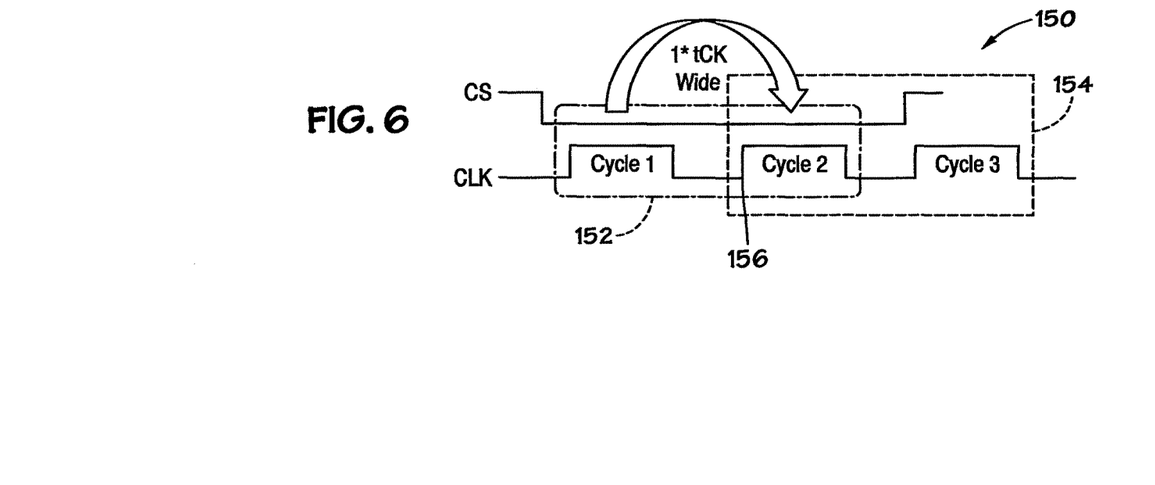
FIG. 6 illustrates a timing diagram where a ghost command may be triggered in 1N mode.
Figure 7:
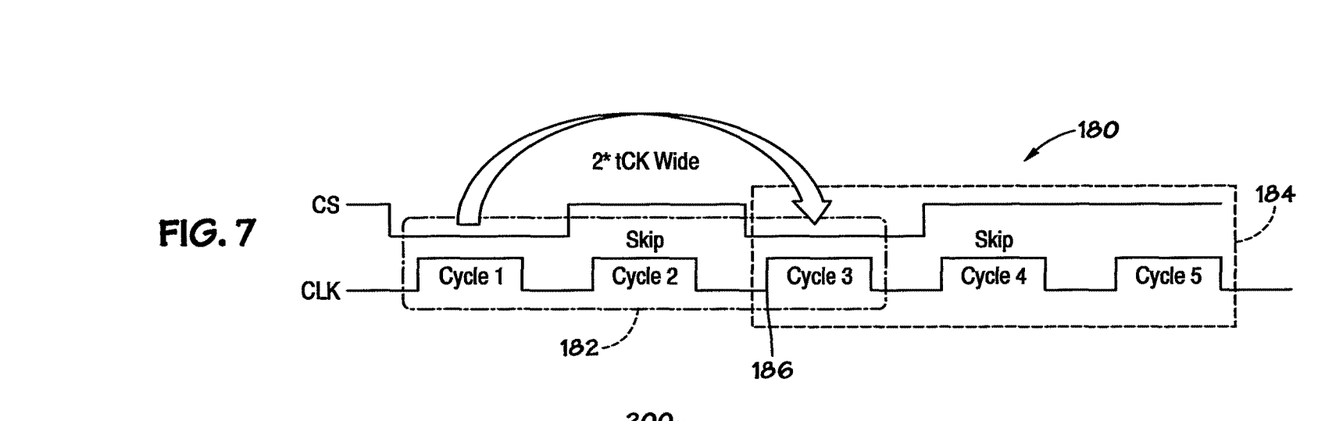
FIG. 7 illustrates a timing diagram where a ghost command may be triggered in 2N mode.
Figure 8:
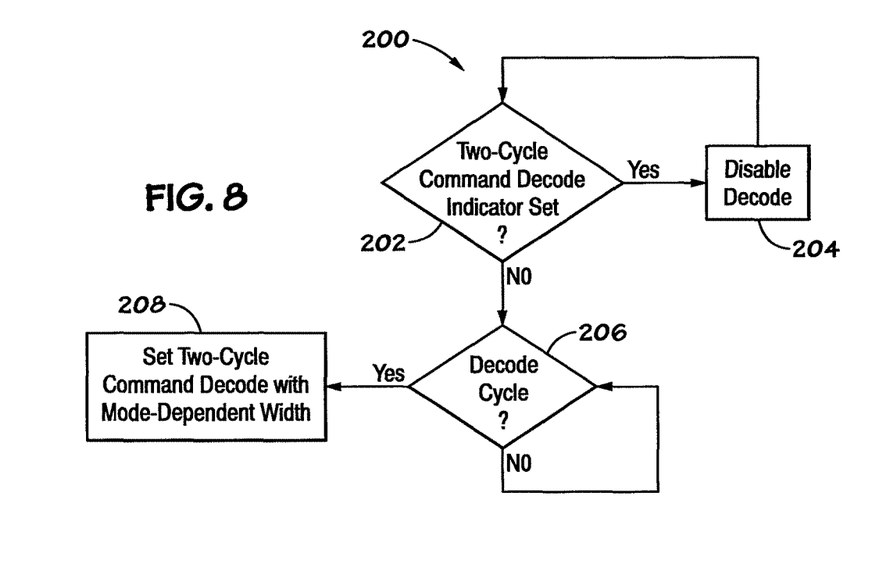
FIG. 8 is a flowchart that illustrates a process for handling potential ghost commands, in accordance with an embodiment.

Without careful consideration, ghost commands (e.g., unintended commands) may be inadvertently triggered. FIG. 6 illustrates a timing diagram where a ghost command may be triggered in 1N mode. FIG. 7 illustrates a timing diagram where a ghost command may be triggered in 2N mode. FIG. 8 is a flowchart that illustrates a process for handling potential ghost commands, in accordance with an embodiment.

Starting first with potential ghost commands in 1N mode, as mentioned above, FIG. 6 illustrates a scenario 150 where ghost commands may be triggered in 1N mode. As illustrated, the "Cycle1"/"Cycle2" pair 152 may be a cancelled two-cycle command, as CS is held low for both "Cycle1" and subsequent "Cycle2". Unfortunately, however, if only a current CS state is used to determine the two-cycle command, the "Cycle2"/"Cycle3" pair 154 may be detected as a normal two-cycle command, as CS is low for the first cycle "Cycle2" and high for the second cycle "Cycle3" of the "Cycle2"/"Cycle3" pair. Further, a portion of the command address capture (e.g., CA<5:0> at period 156 intended for the "Cycle1"/"Cycle2" cancelled two-cycle command may match one of the normal two-cycle command decode signals, inadvertently causing a particular two-cycle normal command to be fired based upon the "Cycle2"/"Cycle3" command.

FIG. 7 illustrates a scenario 180 where ghost commands may be trigged in 2N mode. As illustrated, the CS signal transitions to low, causing the first command address capture at "Cycle1". Because the command execution is in 2N mode, the subsequent cycle, "Cycle2" is skipped and the second command address capture and the resultant two-cycle command is triggered at the third cycle "Cycle3". Thus, the two-cycle command, based on "Cycle1" and "Cycle3" is acquired inside block 182. However, a ghost command 184 may be triggered when the CS drops to low prior to the third cycle "Cycle3" (e.g., for a cancelled command) and a portion (e.g., CA<5:0> of the intended second command address capture in "Cycle3" matches a normal two-cycle command decode signal at period 186. In such a case, if the commands are determined merely based upon a current state of CS, the ghost command 184 may be triggered based upon command address captures triggered by the third and fifth cycles "Cycle3" and "Cycle5".

To avoid triggering of such ghost commands in 1N and 2N modes, an additional indicator may be initiated during a command decode. The indicator may indicate that a two-cycle command decode is currently in progress, such that additional decodes are disabled until the two-cycle command decode is complete. FIG. 8 is a flowchart that illustrates a process 200 for handling potential ghost commands. The process begins by determining if a two-cycle command decode indicator is set (decision block 202). As discussed below, the indicator is set when the decode cycle is initiated (e.g., when an actual decode indicator is captured in the command address).

When the two-cycle command decode indicator is set, the decode is disabled (block 204). Further, the indicator is reset after the disabled decode, such that the indicator can be reused for a new cycle.

If the two-cycle command decode indicator is not set, a determination is made as to whether the current cycle is a decode cycle (decision block 206). If the cycle is not a decode cycle, the process 200 may restart. However, when the cycle is a decode cycle, the two-cycle command decode is set for a mode-dependent width (block 208). For example, in the 1N mode, the width of the indicator is set to one times the clock period (i.e., 1*tCK), such that the decode is disabled for cycles after a decoded cycle. In 2N mode, the width of the indicator is set to 2*tCK, such that the decode is disabled for two cycles after the decode cycle.

As may be appreciated, the current techniques may facilitate fast and efficient command acquisition and execution. Multiple command acquisition modes may provide flexibility to extend command acquisition in some scenarios and maximize the frequency of command acquisition in other scenarios.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A tangible, non-transitory, machine-readable medium, comprising machine-readable instructions, that when executed by one or more processors cause the one or more processors to:
   identify a command acquisition mode from a plurality of command acquisition modes of a command interface of a memory device;
   identify a state of a chip select signal (CS);
   when the CS transitions to low from high:
      capture a first portion of a command address in a first clock cycle after the CS transitions;
      when the command acquisition mode is in a first mode, capture a second portion of the command address in a second clock cycle immediately after the first clock cycle;
      otherwise, when the command acquisition mode is in a second mode, capture the second portion of the command address in a third clock cycle immediately following the second clock signal; and
      fire an internal command, using the first portion of the command address and the second portion of the command address.

2. The machine-readable medium of claim 1, comprising machine-readable instructions, that when executed by one or more processors cause the one or more processors to:
   when the command acquisition mode is in the second mode maintain a toggle indicating when a cycle is a decode cycle.

3. The machine-readable medium of claim 2, comprising machine-readable instructions, that when executed by one or more processors cause the one or more processors to:
   when the toggle indicates that a cycle immediately previous to the current cycle is a decode cycle, skip command address acquisition during the current cycle.

4. The machine-readable medium of claim 2, comprising machine-readable instructions, that when executed by one or more processors cause the one or more processors to:
   when the toggle indicates that a cycle immediately previous to the current cycle is not a decode cycle, perform command address acquisition during the current cycle.

5. The machine-readable medium of claim 2, comprising machine-readable instructions, that when executed by one or more processors cause the one or more processors to:
   when the CS is low, maintain the toggle by alternating the toggle between a high state and a low state for alternating cycles.

6. The machine-readable medium of claim 1, wherein the CS is low during the first clock cycle and the second clock cycle.

7. The machine-readable medium of claim 1, comprising machine-readable instructions, that when executed by one or more processors cause the one or more processors to:
   determine whether a two-cycle command decode indicator is set.

8. The machine-readable medium of claim 7, comprising machine-readable instructions, that when executed by one or more processors cause the one or more processors to:
   when the two-cycle command decode indicator is set, disable decoding in a current cycle.

9. The machine-readable medium of claim 8, comprising machine-readable instructions, that when executed by one or more processors cause the one or more processors to:
   when the two-cycle command decode indicator is not set, determine whether a current cycle is a decode cycle.

10. The machine-readable medium of claim 9, comprising machine-readable instructions, that when executed by one or more processors cause the one or more processors to:
    when the current cycle is a decode cycle, set the two-cycle command decode for a mode-dependent width.

11. The machine-readable medium of claim 10, comprising machine-readable instructions, that when executed by one or more processors cause the one or more processors to:
    wherein the mode-dependent width comprises one clock cycle when the command acquisition mode is in the first mode.

12. The machine-readable medium of claim 10, comprising machine-readable instructions, that when executed by one or more processors cause the one or more processors to:
    wherein the mode-dependent width comprises two clock cycles when the command acquisition mode is in the second mode.

13. A command interface of a memory device, comprising circuitry, configured to:
    identifies a command acquisition mode from a plurality of command acquisition modes of a command interface of a memory device;

identifies a state of a chip select signal (CS);
when the CS transitions to low from high:
- captures a first portion of a command address in a first clock cycle after the CS transitions;
- when the command acquisition mode is in a first mode, captures a second portion of the command address in a second clock cycle immediately after the first clock cycle;
- otherwise, when the command acquisition mode is in a second mode, captures the second portion of the command address in a third clock cycle immediately following the second clock signal; and
- fires an internal command, using the first portion of the command address and the second portion of the command address.

14. The command interface of claim 13, comprising circuitry, configured to:
- maintains a toggle indicating when a cycle is a decode cycle.

15. The command interface of claim 14, comprising circuitry, configured to:
- determines, via the toggle, that a cycle previous to the current cycle is a decode cycle; and
- based upon the cycle immediately previous to the current cycle being a decode cycle, skips command address acquisition during the current cycle.

16. The command interface of claim 14, comprising circuitry, configured to:
- determines, via the toggle, that a cycle immediately previous to the current cycle is not a decode cycle; and
- based upon the cycle immediately previous to the current cycle not being a decode cycle, performs command address acquisition during the current cycle.

17. The command interface of claim 14, comprising circuitry, configured to:
- determines whether a two-cycle command decode indicator is set.

18. The command interface of claim 17, comprising circuitry, configured to:
- when the two-cycle command decode indicator is set, disables decoding in a current cycle; and
- otherwise, when the two-cycle command decode indicator is not set:
  - determines whether a current cycle is a decode cycle; and
  - when the current cycle is a two-cycle command decode cycle, sets the two-cycle command decode for a mode-dependent width;
  - wherein the mode-dependent width comprises one clock cycle when the command acquisition mode is in the first mode; and
  - wherein the mode-dependent width comprises two clock cycles when the command acquisition mode is in the second mode.

19. A method, comprising:
identifying a command acquisition mode from a plurality of command acquisition modes of a command interface of a memory device;
identifying a state of a chip select signal (CS);
when the CS transitions to low from high:
- capturing a first portion of a command address in a first clock cycle after the CS transitions;
- when the command acquisition mode is in a first mode, capturing a second portion of the command address in a second clock cycle immediately after the first clock cycle;
- otherwise, when the command acquisition mode is in a second mode, capturing the second portion of the command address in a third clock cycle immediately following the second clock signal; and
- firing an internal command, using the first portion of the command address and the second portion of the command address.

20. The method of claim 19, comprising:
determining whether a two-cycle command decode indicator is set;
determining the first clock cycle, using the two-cycle command decode indicator.

* * * * *